United States Patent [19]
Yoeli et al.

[11] Patent Number: 6,150,878
[45] Date of Patent: Nov. 21, 2000

[54] LOW VOLTAGE DEVICE OPERABLE WITH A HIGH VOLTAGE SUPPLY

[75] Inventors: Uzi Yoeli, Haifa, Israel; Zvi Orbach, Sunnyvale, Calif.

[73] Assignee: Chip Express (Israel) Ltd., Haifa, Israel

[21] Appl. No.: 09/005,604

[22] Filed: Jan. 12, 1998

[51] Int. Cl.[7] .................................................. H01L 25/00
[52] U.S. Cl. .......................................... 327/566; 327/565
[58] Field of Search ................................... 327/540, 541, 327/564, 565, 566

[56] References Cited

U.S. PATENT DOCUMENTS 4,482,985  11/1984  Itoh et al. .
5,309,040   5/1994  Nakano et al. .
5,485,117   1/1996  Furumochi .............................. 327/538
5,631,547   5/1997  Fujioka et al. .

*Primary Examiner*—Terry D. Cunningham
*Attorney, Agent, or Firm*—Browdy and Neimark

[57] ABSTRACT

This invention discloses an integrated circuit device including transistors having predetermined upper voltage limits, a multi-layer metal interconnect structure connecting the transistors to each other and to an external voltage source having a voltage in excess of the predetermined upper voltage limits of a first plurality of the transistors, and a voltage reducer connected along the interconnect structure between the external voltage source and the first plurality of the transistors.

22 Claims, 3 Drawing Sheets

FIG. 3
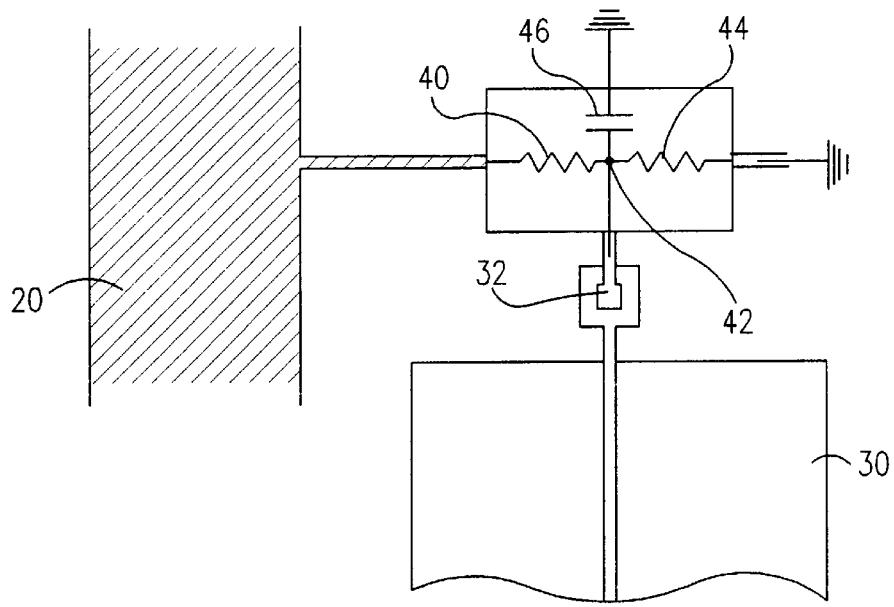
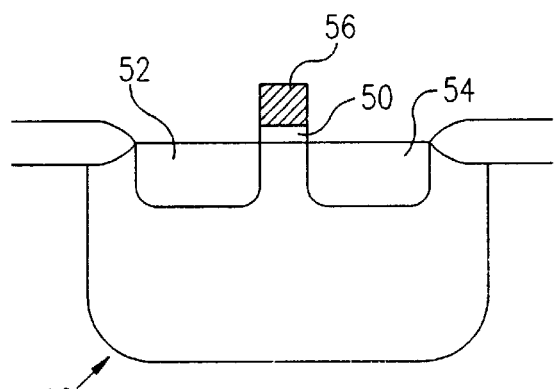
FIG. 4A
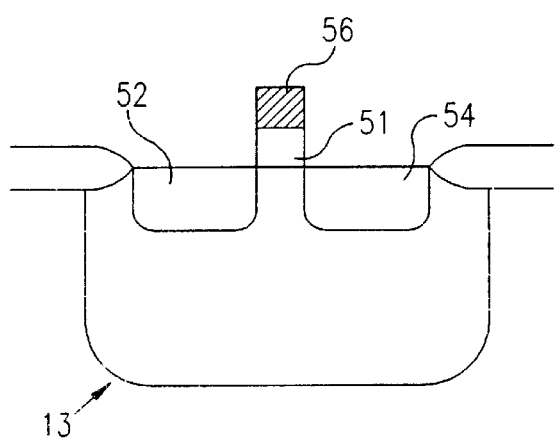
FIG. 4B 6,150,878

LOW VOLTAGE DEVICE OPERABLE WITH A HIGH VOLTAGE SUPPLY

FIELD OF THE INVENTION

The present invention relates to integrated circuit devices generally and more particularly to deep sub-micron devices.

BACKGROUND OF THE INVENTION

As the critical dimensions of integrated circuit devices become increasingly smaller and fall within the deep sub-micron range, the voltages at which individual transistors therein operate decrease accordingly. Difficulties often arise in adapting deep sub-micron devices to systems having voltage sources which provide output voltages at levels which exceed those at which the deep sub-micron devices operate.

An example of such a difficulty is the need for inboard pin to pin compatibility of deep sub-micron devices with corresponding earlier generation devices operating at significantly higher voltages.

SUMMARY OF THE INVENTION

The present invention seeks to provide an improved integrated circuit device which overcomes the above-described limitations of the prior art.

There is thus provided in accordance with a preferred embodiment of the present invention an integrated circuit device including transistors having predetermined upper voltage limits, a multi-layer metal interconnect structure connecting the transistors to each other and to an external voltage source having a voltage in excess of the predetermined upper voltage limits of a first plurality of transistors, and a voltage reducer connected along the interconnect structure between the external voltage source and the first plurality of transistors.

Further in accordance with a preferred embodiment of the present invention the integrated circuit device is a programmable device, such as field programmable gate array, mask programmable gate array or laser programmable gate array.

Additionally in accordance with a preferred embodiment of the present invention the first plurality of transistors constitutes at least 50% of the total number of transistors in the integrated circuit device.

Alternatively the first plurality of transistors constitutes at least 90% of the total number of transistors in the integrated circuit device.

Still further in accordance with a preferred embodiment of the present invention the voltage reducer comprises an N-transistor having a source connected to the external voltage source, a gate connected via a voltage divider including a capacitor to the external voltage source and to ground and a drain connected to at least some of the first plurality of transistors.

Moreover in accordance with a preferred embodiment of the present invention the voltage reducer comprises a plurality of voltage reducers which are generally uniformly distributed over a periphery of the integrated circuit device.

Further in accordance with a preferred embodiment of the present invention the voltage reducer comprises a voltage reducer transistor, and the first plurality of transistors each comprise a first gate oxide and the voltage reducer transistor comprises a second gate oxide and wherein the second gate oxide is thicker than the first gate oxide.

Still further in accordance with a preferred embodiment of the present invention the first plurality of transistors constitutes at least 50% of the total number of transistors in the integrated circuit device.

Alternatively the first plurality of transistors constitutes at least 90% of the total number of transistors in the integrated circuit device.

Additionally in accordance with a preferred embodiment of the present invention the external voltage source has a single output voltage which is in excess of the predetermined upper voltage limits of a first plurality of transistors.

There is also provided in accordance with another preferred embodiment of the present invention an integrated circuit device including transistors having predetermined upper voltage limits, a multi-layer metal interconnect structure connecting the transistors to each other and to an external voltage source having a single output voltage which is in excess of the predetermined upper voltage limits of a first plurality of the transistors, and a voltage reducer connected along the interconnect structure between the external voltage source and the first plurality of the transistors.

Further in accordance with a preferred embodiment of the present invention the voltage reducer comprises an N-transistor having a source connected to the external voltage source, a gate connected to the external voltage source and to ground via a voltage divider including a capacitor and a drain connected to at least some of the first plurality of transistors.

Still further in accordance with a preferred embodiment of the present invention the first plurality of transistors each comprise a first gate oxide and the N-transistor comprises a second gate oxide and wherein the second gate oxide is thicker than the first gate oxide.

BRIEF DESCRIPTION OF THE DRAWINGS

The present invention will be understood and appreciated more fully from the following detailed description, taken in conjunction with the drawings in which:

FIG. 3 is a simplified illustration of a voltage divider useful in the voltage reducer of FIG. 2; and FIGS. 4A and 4B are sectional illustrations of two different types of transistors employed in the integrated circuit of FIG. 1, showing the difference in the thickness of their respective oxide layers.

DETAILED DESCRIPTION OF A PREFERRED EMBODIMENT

Figure 1:
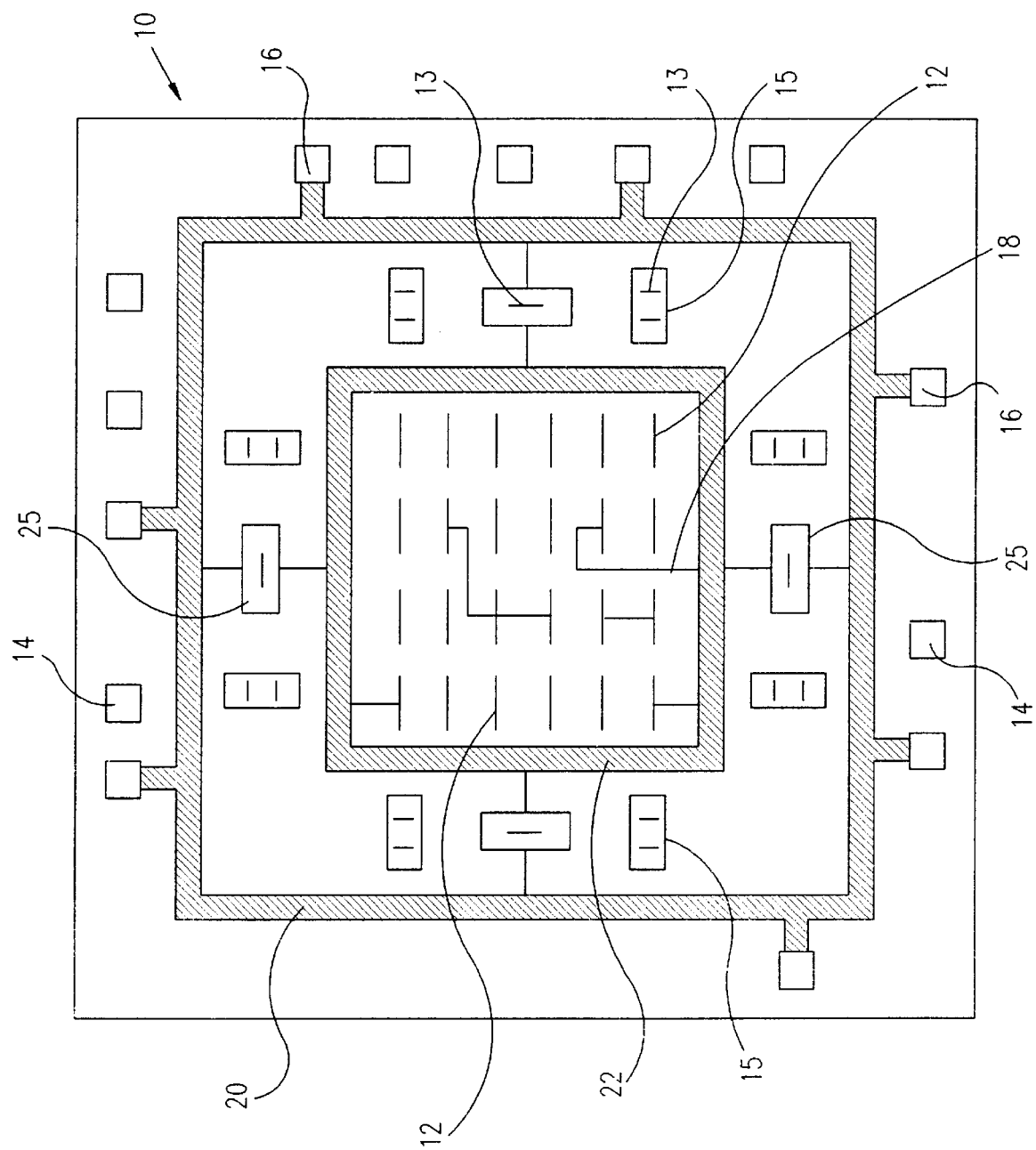
FIG. 1 is a simplified illustration of an integrated circuit device constructed and operative in accordance with a preferred embodiment of the present invention.

Reference is now made to FIG. 1, which illustrates an integrated circuit device constructed and operative in accordance with a preferred embodiment of the present invention. The integrated circuit device comprises a semiconductor substrate 10 onto which are formed a multiplicity of transistors, including transistors 12 having a relatively low upper voltage limit and transistors 13, having a relatively high upper voltage limit.

Disposed adjacent the periphery of the substrate 10 are a first plurality of pads 14 which provide electrical signal connections to some of the transistors 13 which belong to I/O cells 15, and a second plurality of pads 16 which provide electrical power to the transistors 13. Pads 14 and 16 form part of a multilayer metal interconnect network 18 which also includes an outer, high voltage, metal ring 20 and an inner, low voltage, metal ring 22. It is noted that although in the illustrated embodiment, the pads 14 and 16 are shown at the periphery of the substrate, alternatively pads may be located at any other suitable location on the substrate.

Pads 16 are connected to metal ring 20. Metal ring 20 is connected to metal ring 22 via multiple voltage reducers 25 which include some of transistors 13. Metal ring 22 powers transistors 12. Transistors 12 receive electrical signals from I/O cells 15. Metal ring 22 is not directly connected to any of pads 14 and 16.

Figure 2:
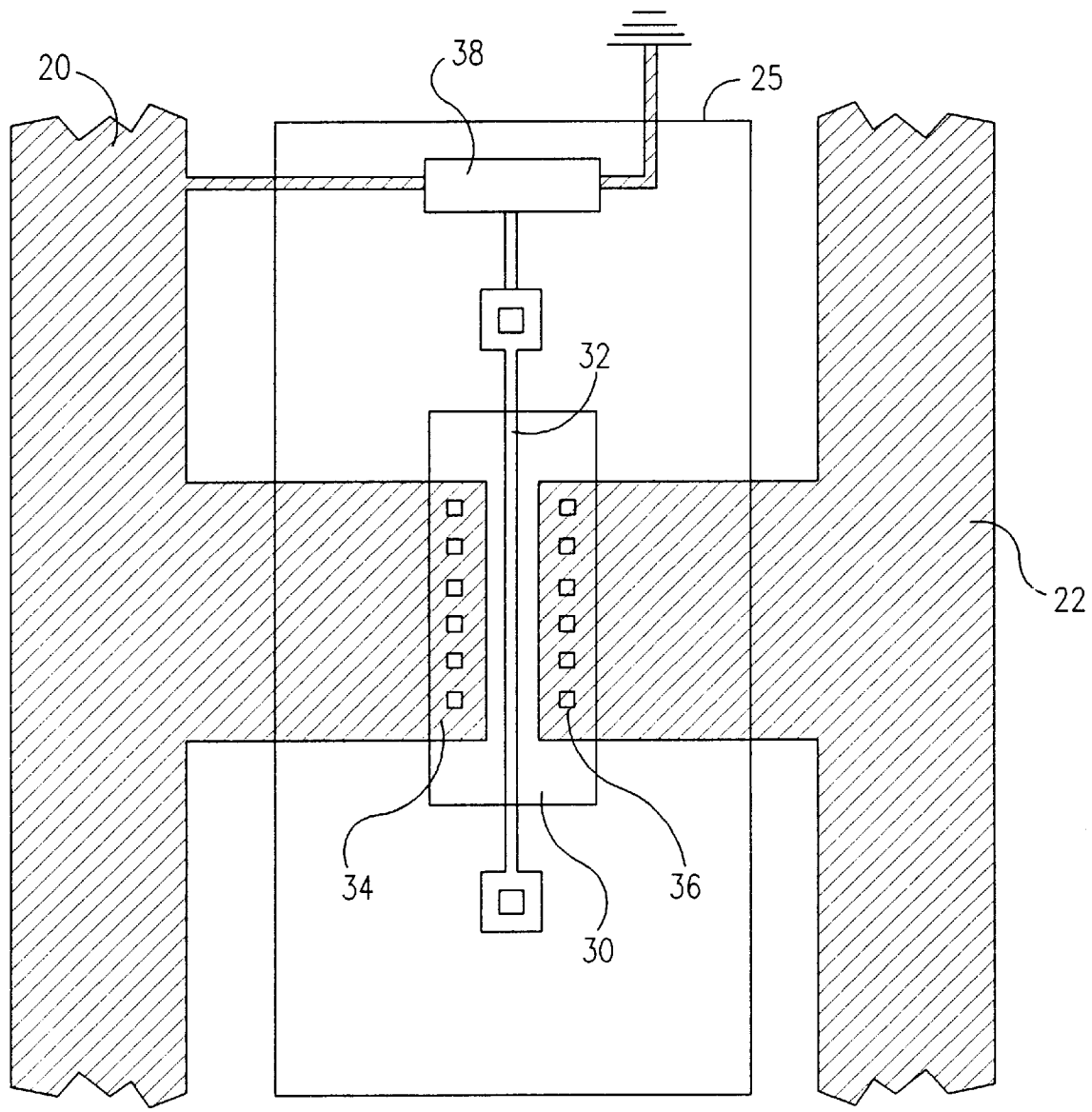
FIG. 2 is a simplified illustration of a voltage reducer useful in the integrated circuit device of FIG. 1.

Reference is now made to FIG. 2, which illustrates a preferred embodiment of a voltage reducer 25 useful in the embodiment of FIG. 1 and employing an N-transistor. As seen in FIG. 2, an N-transistor 30 includes a gate 32, a source 34 and a drain 36. The source 34 is connected to outer ring 20 (FIG. 1) and the drain is connected to inner ring 22 (FIG. 1). Gate 32 is connected via a voltage divider 38 to outer ring 20. Preferably N-transistor 30 has a relatively large W/L ratio, preferably exceeding 1000. N-transistor 30 may be implemented as a plurality of transistors connected in parallel.

Referring now to FIG. 3, it is seen that voltage divider 38 preferably comprises a resistor R1 40 connected between outer ring 20 and a junction 42, connected to gate 32 (FIG. 2), and a resistor R2 44 connected between junction 42 and ground. Preferably, but not necessarily, a capacitor 46 is connected between junction 42 and ground.

In order to provide a desired relatively low voltage VL at the inner ring 22, which voltage does not exceed the predetermined upper voltage limits of transistors 12 or an even lower voltage limit which is selected, the ratio of resistances of the resistors R1 and R2 must be determined in accordance with the following equation:

$$R1/R2=[VH-(VL+VT)]/(VL+VT)$$

where VT is the threshold voltage of transistors 13 and VH is the voltage of the outer ring 20, pad 16 and of the external voltage source.

Reference is now made to FIGS. 4A and 4B are sectional illustrations of two different types of transistors employed in the integrated circuit of FIG. 1, showing the difference in the thickness of their respective oxide layers. It is seen in FIG. 4A that a transistor 12 (FIG. 1) having a relatively low predetermined upper voltage limit, has a relatively thin gate oxide layer 50. In contrast, a transistor 13 (FIG. 1), shown in FIG. 4B, has a relatively thick gate oxide layer 51. For 0.35 micrometer geometry integrated circuit devices, an example of the thickness of gate oxide layer 50 is 80 angstrom, while an example of the thickness of gate oxide layer 51 is 110 angstrom.

Other than the difference in their gate oxide layers as indicated, the remainder of the cross section of transistors 12 and 13 may be identical, as indicated by identical reference numerals 52 indicating their sources, 54 indicating their drains and 56 indicating their gates.

It will be appreciated by persons skilled in the art that the present invention is particularly useful for operating 0.35 micrometer geometry integrated circuit devices in systems which supply only voltages of 5 volts, such as PCs and workstations, rather than at a voltage of 3.3 volts which is conventional for devices having this geometry. It is appreciated that for increasingly smaller geometries, even lower voltage limits apply for the transistors 12 and the present invention is equally applicable thereto.

It will be appreciated by persons skilled in the art that the present invention is not limited by what has been particularly shown and described hereinabove. Rather the scope of the present invention includes both combinations and sub-combinations of the various features described hereinabove as well as modifications and variations thereof which would occur to a person skilled in the art reading the disclosure and which are not in the prior art.

What is claimed is:

1. An integrated circuit arrangement comprising:

transistors having predetermined upper voltage limits, wherein the transistors are connected to each other and to an external voltage source having a voltage in excess of the predetermined upper voltage limits of a first plurality of said transistors, by a multi-layer metal structure;

and at least one voltage reducer connected along said multi-layer metal structure between said external voltage source and said first plurality of said transistors, wherein:

said plurality of transistors each comprise a first gate oxide and said voltage reducer transistor comprises a second gate oxide and wherein said second gate oxide is thicker than the first gate oxide, a thickness of said first gate oxide being not greater than 80 angstroms and a thickness of said second gate oxide being not greater than 110 angstroms, and wherein said at least one voltage reducer comprises an N-transistor having a source connected to said external voltage source, a gate connected to said external voltage source and to ground via a voltage divider including a capacitor and a drain connected to at least some of said first plurality of transistors.

2. An integrated circuit arrangement according to claim 1 wherein said first plurality of transistors constitutes at least 50% of the total number of said transistors in said integrated circuit arrangement.

3. An integrated circuit arrangement according to claim 1 wherein said first plurality of transistors constitutes at least 90% of the total number of said transistors in said integrated circuit arrangement.

4. An integrated circuit device according to claim 2 and wherein said external voltage source has a single output voltage which is in excess of the predetermined upper voltage limits.

5. An integrated circuit device according to claim 3 and wherein said external voltage source has a single output voltage which is in excess of the predetermined upper voltage limits.

6. An integrated circuit arrangement according to claim 1 wherein said at least one voltage reducer comprises a plurality of voltage reducers which are generally uniformly distributed over a periphery of the integrated circuit device.

7. An integrated circuit arrangement comprising:

transistors having predetermined upper voltage limits;

the transistors are connected to each other and to an external voltage source having a single output voltage which is in excess of the predetermined upper voltage limits of a first plurality of said transistors, by a multi-layer metal structure;

and at least one voltage reducer connected along said multi-layer metal structure between said external voltage source and said first plurality of said transistors, wherein said plurality of transistors each comprise a first gate oxide and said voltage reducer transistor comprises a second gate oxide and wherein said second gate oxide is thicker than the first gate oxide, a thickness of said first gate oxide being not greater than 80 angstroms and a thickness of said second gate oxide being not greater than 110 angstroms, and wherein said at least one voltage reducer comprises an N-transistor having a source connected to said external voltage source, a gate connected to said external voltage source and to ground via a voltage divider including a capacitor and a drain connected to at lease some of said first plurality of transistors.

8. An integrated circuit according to claim 7 and wherein said first plurality of transistors each comprise a first gate oxide and said N-transistor comprises a second gate oxide and wherein said second gate oxide is thicker than said first gate oxide.

9. An integrated circuit according to claim 7 and wherein said first plurality of transistors each comprise a first gate oxide and said N-transistor comprises a second gate oxide and wherein said second gate oxide is thicker than said first gate oxide.

10. An integrated circuit device according to claim 7 and wherein:

said voltage reducer comprises a voltage reducer transistor; and said first plurality of transistors each comprise a first gate oxide and said voltage reducer transistor comprises a second gate oxide and wherein said second gate oxide is thicker than said first gate oxide.

11. An integrated circuit arrangement comprising:

a multiplicity of transistors connected to each other and to an external voltage source having a voltage in excess of a predetermined voltage, by a multi-layer metal structure; and at least one voltage reducer connected along said multi-layer metal structure between said external voltage source and a first plurality of transistors forming part of said multiplicity of transistors, whereby the voltage supplied to said first plurality of transistors does not exceed said predetermined voltage, wherein said plurality of transistors each comprises a first gate oxide and said at least one voltage reducer transistor comprises a second gate oxide and wherein said second gate oxide is thicker than the first gate oxide, a thickness of said first gate oxide being not greater than 80 angstroms and a thickness of said second gate oxide being not greater than 110 angstroms, and wherein said at least one voltage reducer comprises an N-transistor having a source connected to said external voltage source, a gate connected to said external voltage source and to ground via a voltage divider including a capacitor and a drain connected to at least some of said first plurality of transistors.

12. An integrated circuit device according to claim 11 and wherein said first plurality of transistors are produced differently from the remainder of said multiplicity of transistors.

13. An integrated circuit device according to claim 11 and wherein said first plurality of transistors constitutes at least 50% of the total number of transistors in said integrated circuit device.

14. An integrated circuit device according to claim 11 and wherein said first plurality of transistors constitutes at least 90% of the total number of transistors in said integrated circuit device.

15. An integrated circuit device according to claim 12 and wherein said first plurality of transistors constitutes at least 50% of the total number of transistors in said integrated circuit device.

16. An integrated circuit device according to claim 12 and wherein said first plurality of transistors constitutes at least 90% of the total number of transistors in said integrated circuit device.

17. An integrated circuit device according to claim 12 and wherein said external voltage source has a single output voltage which is in excess of the predetermined voltage.

18. An integrated circuit device according to claim 13 and wherein said external voltage source has a single output voltage which is in excess of the predetermined voltage.

19. An integrated circuit device according to claim 14 and wherein said external voltage source has a single output voltage which is in excess of the predetermined voltage.

20. An integrated circuit device according to claim 11 and being a programmable device.

21. An integrated circuit device according to claim 12 and being a programmable device.

22. An integrated circuit arrangement according to claim 11 wherein said at least one voltage reducer comprises a plurality of voltage reducers which are generally uniformly distributed over a periphery of the integrated circuit device.

* * * * *